(12) United States Patent
Saint-Laurent et al.

(10) Patent No.: US 7,902,878 B2
(45) Date of Patent: Mar. 8, 2011

(54) CLOCK GATING SYSTEM AND METHOD

(75) Inventors: Martin Saint-Laurent, Austin, TX (US); Bassam Jamil Mohd, Austin, TX (US); Paul Bassett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/431,992

(22) Filed: Apr. 29, 2009

(65) Prior Publication Data

US 2009/0267649 A1    Oct. 29, 2009

Related U.S. Application Data

(60) Provisional application No. 61/048,661, filed on Apr. 29, 2008.

(51) Int. Cl.
*H03K 19/096* (2006.01)

(52) U.S. Cl. .............................. 326/98; 326/95

(58) Field of Classification Search ............. 326/93, 326/95, 98; 327/200–218, 291, 298, 365, 327/379
See application file for complete search history.

(56) References Cited

U.S. PATENT DOCUMENTS

| | | | | |
|---|---|---|---|---|
| 5,598,112 A | * | 1/1997 | Phillips | 326/93 |
| 5,822,700 A | | 10/1998 | Hult et al. | |
| 5,883,529 A | * | 3/1999 | Kumata et al. | 326/93 |
| 5,920,547 A | | 7/1999 | Werth | |
| 5,936,449 A | | 8/1999 | Huang | |
| 6,133,762 A | | 10/2000 | Hill | |
| 6,157,839 A | | 12/2000 | Cerwall et al. | |
| 6,204,695 B1 | * | 3/2001 | Alfke et al. | 326/93 |
| 6,456,115 B2 | * | 9/2002 | Li et al. | 326/95 |
| 6,552,272 B1 | * | 4/2003 | Sheng et al. | 174/117 FF |
| 6,552,572 B1 | | 4/2003 | Cheung | |
| 7,068,080 B1 | * | 6/2006 | Sanders | 327/99 |
| 7,109,776 B2 | * | 9/2006 | Tschanz et al. | 327/298 |
| 7,365,575 B2 | * | 4/2008 | Kim | 326/95 |
| 7,450,587 B2 | | 11/2008 | Gruhn et al. | |
| 7,519,016 B2 | | 4/2009 | Lee et al. | |

(Continued)

FOREIGN PATENT DOCUMENTS

GB    2420034    5/2006

(Continued)

OTHER PUBLICATIONS

Harris, David. "Skew-Tolerant Circuit Design," 2001, pp. 52-55, Academic Press.

(Continued)

*Primary Examiner* — Vibol Tan
(74) *Attorney, Agent, or Firm* — Peter M. Kamarchik; Nicholas J. Pauley; Jonathan T. Velasco

(57) ABSTRACT

A clock gating system and method is disclosed. In a particular embodiment, the system includes an input logic circuit having at least one input to receive at least one input signal and having an output at an internal enable node. A keeper circuit includes at least one switching element that is responsive to a gated clock signal and is coupled to the internal enable node to selectively hold a logical voltage level at the internal enable node. The system further includes a gating element responsive to an input clock signal and to the logical voltage level at the internal enable node to generate the gated clock signal.

25 Claims, 6 Drawing Sheets

U.S. PATENT DOCUMENTS

| | | | |
|---|---|---|---|
| 7,587,686 B1 * | 9/2009 | Schleicher, II | 716/1 |
| 7,612,597 B2 * | 11/2009 | Matsumoto | 327/291 |
| 7,639,057 B1 * | 12/2009 | Su | 327/291 |
| 2003/0228865 A1 | 12/2003 | Terry | |
| 2004/0237054 A1 | 11/2004 | Tsai | |
| 2006/0097754 A1 * | 5/2006 | Kim | 326/95 |
| 2007/0024318 A1 * | 2/2007 | Mamidipaka | 326/38 |

FOREIGN PATENT DOCUMENTS

| | | |
|---|---|---|
| WO | 2005036422 | 4/2005 |

OTHER PUBLICATIONS

Mohd, B. et al. "Reducing Flip-Flop Power for DSP Design," Third Annual Austin Conference on Integrated Systems and Circuits, Austin, TX, May 2008, pp. 34-39.

International Search Report—PCT/US2009/043913, International Search Authority—European Patent Office Jul. 27, 2010.

Written Opinion—PCT/US2009/043913, International Search Authority—European Patent Office Jul. 27, 2010.

* cited by examiner

CLOCK GATING SYSTEM AND METHOD

I. CROSS-REFERENCE TO RELATED APPLICATION(S)

The present disclosure claims the benefit of U.S. Provisional Application No. 61/048,661, filed Apr. 29, 2008, which is incorporated by reference herein in its entirety and to which priority is claimed.

II. FIELD

The present disclosure is generally related to clock gating.

III. DESCRIPTION OF RELATED ART

Advances in technology have resulted in smaller and more powerful personal computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application that can be used to access the Internet. However, power consumption of such portable devices can quickly deplete a battery and diminish a user's experience.

One power saving feature is to use clock gating in one or more clock trees. The clock tree, or clock distribution network, distributes one or more clock signals from a common point to other circuit elements that receive a clock signal. The clock tree often consumes a significant portion of the power consumed by a semiconductor device, and unnecessary power consumption can occur in a branch of a clock tree when the output of the branch is not needed. To conserve power, a technique called clock gating is often used where logic gates and a clock gating cell are used to turn off certain areas of the clock tree when such areas are not in use. However, clock gating cells that are used to perform clock gating also consume power.

IV. SUMMARY

In a particular embodiment, a clock gating system incorporates circuitry that functions as a set-reset latch instead of a traditional pass-gate latch to hold an enable signal on clock gating circuitry. The set-reset latch includes a pair of cross-coupled NOT-AND (NAND) gates. One of the NAND gates is merged with the NAND gate blocking the clock. The clock gating system can reduce the number of transistors and have a smaller area compared to a cell using pass-gate latch. The clock gating system can also reduce the number of transistors that always toggle when the clock signal toggles, reducing the dynamic power consumption as compared to a conventional clock gating cell.

In a particular embodiment, a clock gating circuit is disclosed that includes an input logic circuit having at least one input to receive at least one input signal and having an output coupled to an internal enable node. The clock gating circuit also includes a keeper circuit coupled to selectively hold a logical voltage level at the internal enable node. The keeper circuit includes at least one switching element that is responsive to a gated clock signal. The clock gating circuit also includes a gating element responsive to an input clock signal and to the logical voltage level at the internal enable node to generate the gated clock signal.

In another particular embodiment, a system is disclosed that includes a NAND logic circuit having a first input coupled to receive a clock signal and having an output coupled to provide a gated clock signal. The system includes a keeper circuit coupled to provide an enable signal to a second input of the NAND logic circuit. Less than nine but not less than four transistors toggle with each clock signal transition.

In another particular embodiment, a method is disclosed that includes receiving at least one input signal at an input logic circuit having at least one input and having an output coupled to an internal enable node. The method also includes generating a gated clock signal at a gating element that is responsive to an input clock signal and to a logical voltage level at the internal enable node. The method further includes selectively holding the logical voltage level at the internal enable node in response to the gated clock signal.

In a particular embodiment, the method includes selecting one of a first clock gating cell having a first keeper circuit or a second clock gating cell having a second keeper circuit, where the selection is based on at least one design criterion. In an embodiment, the first clock gating cell may include nine transistors that toggle in response to each clock signal toggle. In another embodiment, fewer than half of the transistors of the second keeper circuit toggle in response to each clock signal toggle. In another embodiment, the design criterion includes power consumption, speed of operation, an area of the first clock gating cell or of the second clock gating cell, or any combination thereof.

One particular advantage provided by at least one of the disclosed embodiments is reduced power consumption of clock gating circuits. Another particular advantage provided by at least one of the disclosed embodiments is a reduced footprint of clock gating circuits. Another particular advantage provided by at least one of the disclosed embodiments is that fewer transistors switch with each clock cycle.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
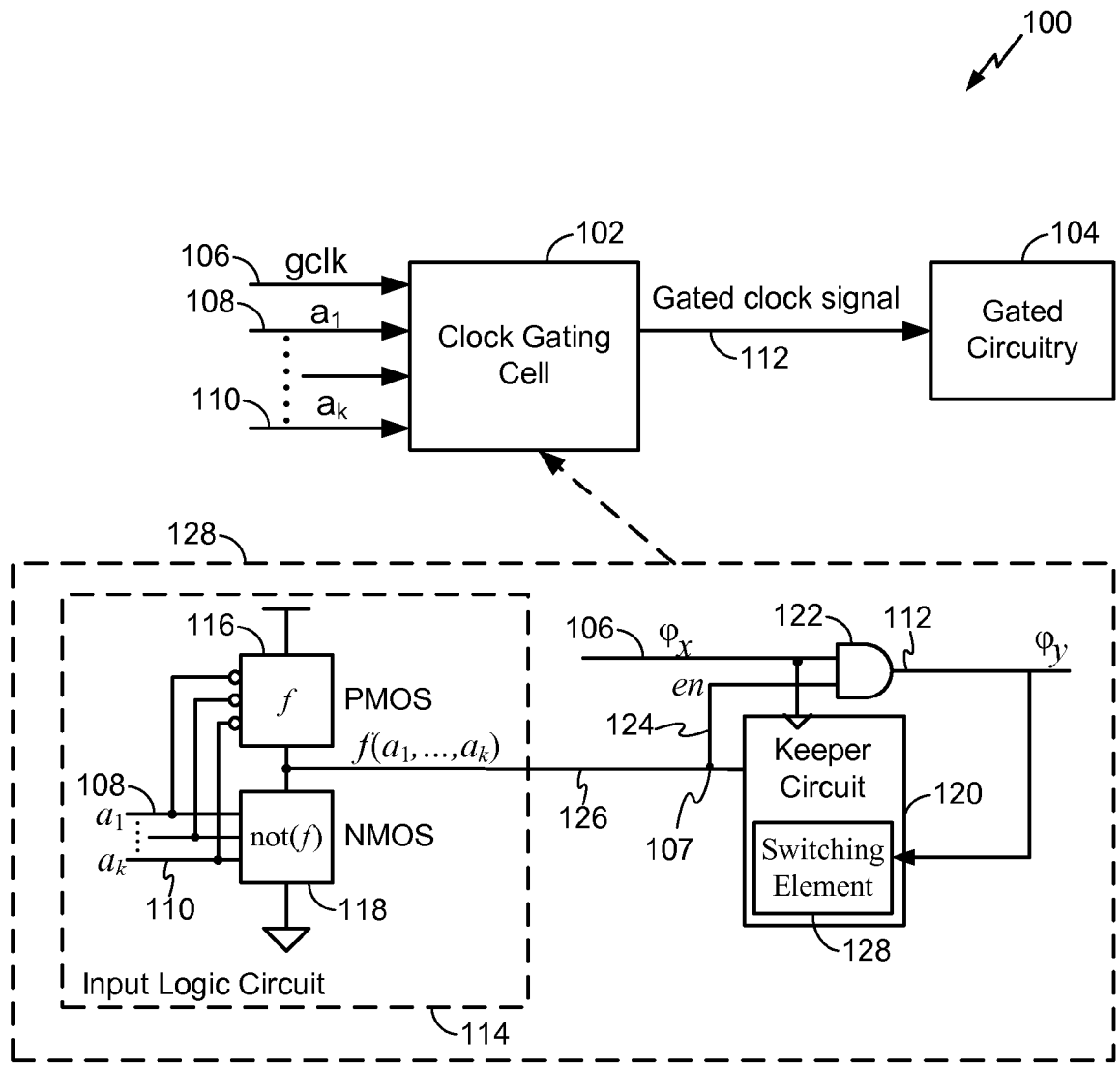
FIG. 1 is a block diagram of a particular illustrative embodiment of a clock gating system.

Referring to FIG. 1, an illustrative embodiment of a system to generate a gated clock signal is depicted and generally designated 100. The system 100 includes a clock gating cell 102 coupled to gated circuitry 104. The clock gating cell 102 receives a clock input 106 and a first input 108. The clock gating cell 102 may also receive one or more additional inputs, such as a second input 110. The clock gating cell 102 provides a gated clock signal 112 to the gated circuitry 104. The clock gating cell 102 contains a clock gating circuit 128.

The clock gating circuit 128 contains an input logic circuit 114 coupled to an internal enable node 107. A keeper circuit 120 and a gating element 122 are also coupled to the internal enable node 107. The keeper circuit 120 includes at least one switching element 128 that is responsive to the gated clock signal 112. Because the switching element 128 is responsive to the gated clock signal 112 instead of a input clock signal received at the clock input 106, the switching element 128 may switch less frequently (i.e., may exhibit fewer toggles) than other elements that are responsive to the input clock signal.

The input logic circuit 114 can function as any logic circuit that produces an output based on values of one or more inputs. As illustrative, non-limiting examples, the input logic circuit 114 can function as an inverter, a NOT OR (NOR) gate, a NOT AND (NAND) gate, an AND OR INVERT (AOI) gate, an OR AND INVERT (OAI) gate, a multiplexer, an exclusive OR gate (XOR) gate, or any other type of logic circuit. In a particular embodiment, the input logic circuit 114 includes a first circuit 116 that performs a first logical function (f) coupled to a second circuit 118 that performs a second logical function (not(f)), where the second logical function provides an inverse of the first logical function. The first circuit 116 may be formed of p-channel metal-oxide-semiconductor (PMOS) elements and the second circuit 118 may be formed of n-channel metal-oxide-semiconductor (NMOS) elements. The input logic circuit 116 has an output 126 that is coupled to the internal enable node 107. The input logic circuit 114 may be configured to bias the internal enable node 107 at a logical voltage level, such as a logic "0" level or a logic "1" level, in response to the first and second logical functions of the one or more input signals 108-110.

In a particular embodiment, the keeper circuit 120 operates substantially as a set-reset latch or a pass-gate latch. The keeper circuit 120 is responsive to the input clock signal 106 and to the gated clock signal 112 to selectively hold a logical voltage level at the internal enable node 107 or to allow the input logic circuit 114 control the voltage level at the internal enable node 107. The keeper circuit 120 includes the switching element 128 that is responsive to the gated clock signal 112. Because the switching element 128 is responsive to the gated clock signal 112, the switching element 128 may switch less frequently than a switching element that is responsive to the input clock signal, reducing a dynamic power consumption of the system 100. For example, the system 100 provides a lower power alternative to conventional clock gating cells that have nine transistors that toggle when the input clock signal toggles. To illustrate, not more than four transistors in the system 100 may toggle with each clock signal transition.

The gating element 122 has a first input coupled to receive the input clock signal 106. The gating element 122 also has a second input coupled to receive an enable signal 124 driven by a logical voltage level at the internal enable node 107. The gating element 122 is responsive to the input clock signal 106 and to the logical voltage level at the internal enable node 107 to generate the gated clock signal 112. As illustrated, the gating element 122 may include circuitry, such as an AND gate, that is configured to generate the gated clock output 112, by selectively propagating the input clock signal 106 or blocking the input clock signal 106, as a logical function of the first and second inputs.

In a first mode of operation where the internal enable signal 124 from the internal enable node 107 is at a logical "0" state (i.e., biased at a voltage that represents a logical low value), the gated clock signal 112 output of the gating element 122 is held at a logical state, such as a logical "0" state, independent of other inputs. In a second mode of operation where the internal enable signal 124 from the internal enable node 107 is at a logical "1" state (i.e., biased at a voltage that represents a logical high value), the value of the gated clock signal 112 is dependent on the clock input 106 and will be either at a logical "0" or a logical "1" state. The one or more inputs 108-110 to the input logic circuit 114 are used to change a logical state of the internal enable node 107 while the input clock signal 106 is low (i.e., at a logical "0" state). In particular, these inputs may include one or multiple signals that force the enable node 107 to a specific value during a test mode. When the input clock signal 106 is high (i.e., at a logical "1" state), the keeper circuit 120 maintains the state of the internal enable signal 124 at the logical "0" or the logical "1" state.

Figure 2:
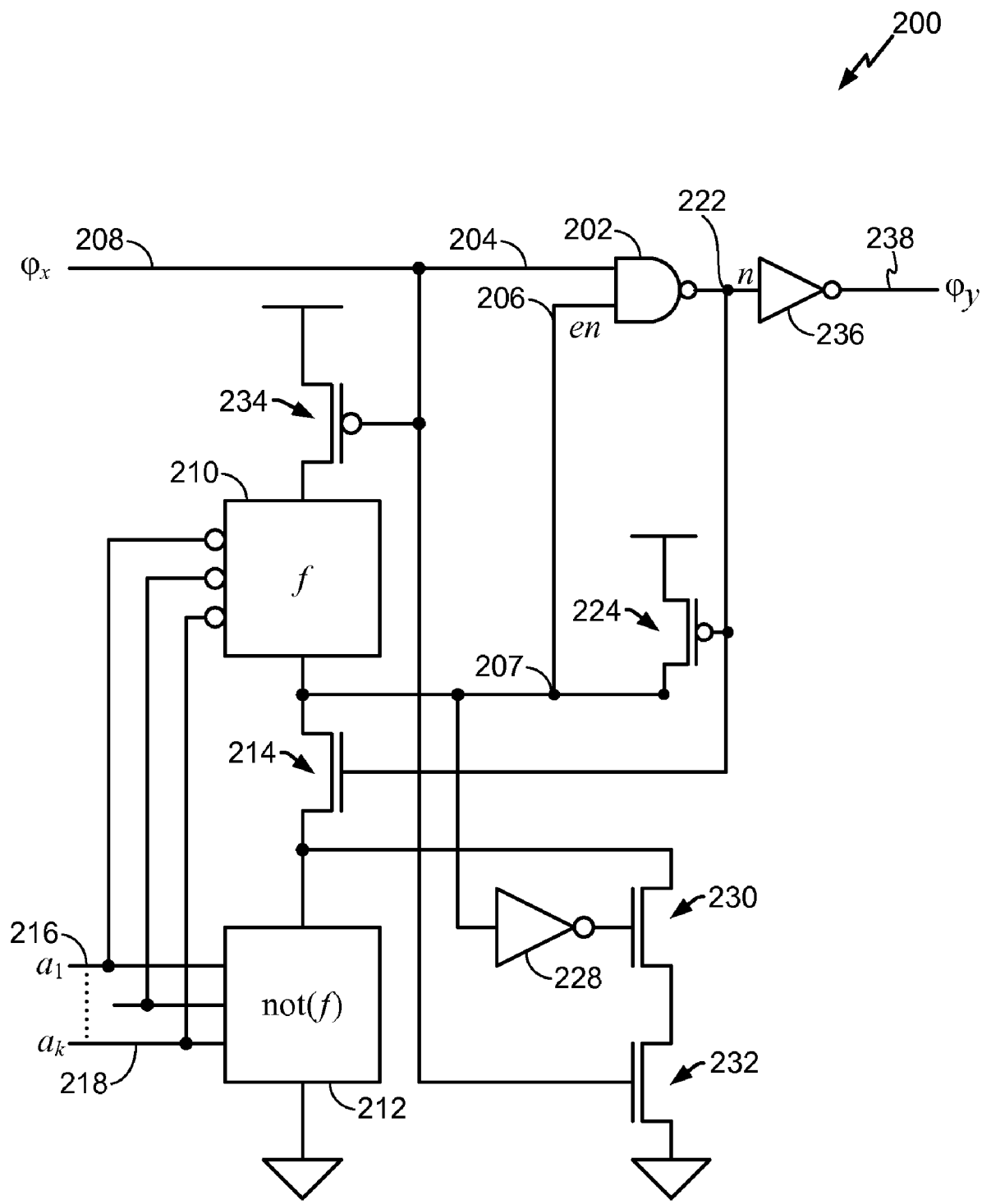
FIG. 2 is a circuit diagram of a first illustrated embodiment of a clock gating cell for use in a clock gating system.

Referring to FIG. 2, a first particular illustrative embodiment of a clock gating system is disclosed and generally designated 200. The clock gating system 200 may operate in a logically equivalent manner as the clock gating circuit 128 of FIG. 1. The system 200 includes a gating element that includes a NOT-AND (NAND) logic circuit 202 having a first input 204 coupled to receive an input clock signal 208. The NAND logic circuit 202 has a second input 206 coupled to receive an enable signal from an internal enable node 207. The NAND logic circuit 202 provides a gated clock signal at a node (n) 222. The gated clock signal at the node 222 is inverted with respect to the input clock signal 208. An inverter 236 coupled to the node 222 generates a second gated clock signal as an output signal 238 that is not inverted with respect to the input clock signal 208. The gated clock signal at the node 222 can be used as an output signal having the opposite polarity of the output signal 238. Alternatively, in a particular embodiment, the inverter 236 can be replaced by a buffer to change the polarity of the output signal 238. In a particular embodiment, the gating element including the NAND logic circuit 202 corresponds to the gating element 122 of FIG. 1.

An input logic circuit includes a pullup circuit 210 and a pulldown circuit 212 serially coupled via an internal enable node 207. In a particular embodiment, the input logic circuit with the pullup circuit 210 and the pulldown circuit 212 may correspond to the input logic circuit 114 of FIG. 1 with the first circuit 116 and the second circuit 118. The pullup circuit 210 may operate to selectively provide a low-impedance path between a supply and the internal enable node 207. The pulldown circuit 212 may operate to selectively provide a low-impedance path between the internal enable node 207 and a ground.

The pullup circuit 210 and the pulldown circuit 212 may be serially coupled to input logic isolation elements, such as a first isolation element 234 and a second isolation element 214, to selectively prevent a current flow through the pullup and pulldown circuits 210 and 212, respectively. At least one of the isolation elements 214, 234 may be responsive to the gated clock signal rather than to the input clock signal 208. For example, the first isolation element 234 may be configured to selectively prevent the pullup circuit 210 from biasing the internal enable node 207 at a logical high voltage level. The second isolation element 214 may be configured to selectively prevent the pulldown circuit from biasing the internal enable node 207 at a logical low voltage level.

The first isolation element 234 is illustrated as a switching element that has a first terminal coupled to the supply and a control terminal coupled to the input clock signal 208. In a particular embodiment, the first isolation element 234 is a p-channel metal-oxide-semiconductor (PMOS) transistor. The first isolation element 234 has a second terminal that is coupled to the pullup circuit 210. While the pullup circuit 210 and first isolation element 234 are shown connected in series with the first isolation element 234 coupled to the supply, the pullup circuit 210 and the first isolation element 234 can be reordered without changing the functionality of the circuit. In a particular embodiment, the first isolation element 234 is a first field effect transistor (FET).

In the illustrated embodiment, the pullup circuit 210 is coupled to the internal enable node 207 and to a first terminal of the second isolation element 214. In a particular embodiment, the second isolation element 214 is a n-channel MOS (NMOS) transistor having a first terminal coupled to the internal enable node 207 and having a second terminal coupled to the pulldown circuit 212. In another particular embodiment, the second isolation element 214 is a second FET.

The pullup circuit 210 has inputs or control terminals coupled to receive a first signal 216. The pullup circuit 210 may also receive one or more additional inputs, such as a second signal 218. In a particular embodiment, the first signal 216 and optionally the second signal 218 include a signal that causes the output signal 238 to follow an input clock during a test mode or, alternatively, that disables the output signal 238 during the test mode. The pulldown circuit 212 also has inputs or control terminals coupled to receive the first signal 216. The pulldown circuit 212 may also receive one or more additional inputs, such as the second signal 218.

As an illustrative, non-limiting example, the input logic circuit including the pullup circuit 210 and the pulldown circuit 212 may operate as a dual-input NAND logic circuit. For example, the pullup circuit 210 may include a pair of PMOS transistors (not shown) coupled in parallel between the first isolation element 234 and the second isolation element 214, each PMOS transistor responsive to a corresponding input signal 216, 218. The pulldown circuit 212 may include a pair of NMOS transistors (not shown) serially coupled between the second isolation element 214 and ground, each NMOS transistor responsive to a corresponding input signal 216, 218.

Switching elements may be used in a keeper circuit that has at least one switching element that is responsive to a gated clock signal. For example, a keeper circuit may include a first switching element, such as a PMOS transistor 224, which has a first terminal coupled to a supply and a second terminal coupled to the enable node 207. The PMOS transistor 224 has a control terminal coupled to the node 222 to be responsive to the gated clock signal.

The keeper circuit also includes a first NMOS transistor 230 that has a first terminal coupled to the second terminal of the PMOS transistor 224 via the second isolation element 214. An inverter 228 has an input coupled to the enable node 207 and an output coupled to a control terminal of the first NMOS transistor 230. The first NMOS transistor 230 has a second terminal coupled to a first terminal of a second NMOS transistor 232. The second NMOS transistor 232 has a second terminal coupled to ground. A control terminal of the second NMOS transistor 232 is coupled to be responsive to the clock signal 208. While the first NMOS transistor 230 and the second NMOS transistor 232 are shown connected in series in a particular order, in other embodiments the serial order of the first NMOS transistor 230 and the second NMOS transistor 232 can changed without changing the functionality of the keeper circuit.

The inverter 228 and the first NMOS transistor 230 form a keeper isolation element that is configured to prevent logical voltage level change at the internal enable node 207 due to a current flow through the keeper circuit during a delay associated with the gating element when the input clock signal 208 transitions from a low logic level to a high logic level. To illustrate, when the internal enable node 207 is biased at a logic high level and the input clock signal 208 transitions to a high logic level, for a brief period both inputs to the NAND logic circuit 202, and also the output of the NAND logic circuit 202, will be at the high logic level. This condition will persist during the delay in the NAND logic circuit 202 until the output of the NAND logic circuit 202 transitions to a low logic level. During this delay period, the second isolation element 214 and the second NMOS transistor 232 may both be on. However, the first NMOS transistor 230 will remain off, preventing a current flow from the internal enable node 207 through the keeper circuit and thus preventing a discharge of the internal enable node 207.

During operation, when the input clock signal 208 is at a logical "0" state, the node 222 is at a logical "1" state by operation of the NAND logic circuit 202. The first isolation element 234 is on and the second isolation element 214 is on, enabling the pullup circuit 210 and the pulldown circuit 212 to set a logical voltage level at the internal enable node 207. In addition, the PMOS transistor 224 and the second NMOS transistor 232 are off. Thus, the enable node 207 may be biased at a logic level representing a result of the logical functions implemented by the pullup and pulldown circuits 210 and 212 as a function of the values of the one or more signals 216-218, but the NAND logic circuit 202 holds the node 222 at logical "1" state, and the inverter 236 holds the output signal 238 at a logical "0" state.

When the input clock signal 208 is at a logical "1" state, a voltage at the enable node 207 is held either at a logical "0" state or a logical "1" state, the first isolation element 234 is off, and the second NMOS transistor 232 is on. When the enable node 207 is at a logical "1" state, the node 222 is at a logical "0" state, the PMOS transistor 224 is on while the second isolation element 214 is off, holding the enable node 207 at the logical "1" state. When the enable node 207 is at a logical "0" state, the node 222 is at a logical "1" state and the PMOS transistor 224 is off while the second isolation element 214, the first NMOS transistor 230, and the second NMOS transistor 232 are on, holding the enable node 207 at the logical "0" state. The one or more signals 216-218 can each change logical states without corrupting the state of the enable node 207, the node 222, and the output signal 238.

When the input clock signal 208 is at a logical "0" state so that the gated clock signal at the node 222 is at a logical "1" state, the voltage at the enable node 207 is determined by the logical response of the pullup circuit 210 and the inverse response of the pulldown circuit 212 to the inputs $a_1$-$a_k$. For example, where the logical response of the pullup circuit 210 to a particular set of inputs $a_1$-$a_k$ results in a low-impedance path between the enable node 207 and the supply voltage node, while the inverse response of the pulldown circuit 212 results in a high-impedance path to ground, the enable node 207 will be biased at a logical "1" state. As another example, when the particular set of inputs $a_1$-$a_k$ causes the pullup circuit 210 to form a high-impedance path to the supply voltage node while the pulldown circuit 212 forms a low-impedance path to ground, the enable node 207 may be biased at a logical "0" state. When the clock signal 208 rises from a logical "0" state to a logical "1" state while the enable node 207 is biased at a logical "1" state, a bias at the node 222 transitions from a logical "1" state to a logical "0" state after a delay associated with the NAND logic circuit 202.

The clock gating system 200 may provide several advantages. For example, the clock gating system 200 reduces a number of transistors of a clock gating cell from twenty to seventeen. In addition, the clock gating system 200 may have a smaller area and consume less leakage power compared to a circuit using a pass-gate latch. As another example, the clock gating system 200 has less than nine transistors that toggle when the input clock signal 208 toggles, thereby reducing the dynamic power consumption compared to a pass-gate latch circuit. In a particular embodiment, the clock gating system 200 may have not less than four transistors that toggle when the input clock signal 208 toggles, including the PMOS transistor 234, the second NMOS transistor 232, and two transistors (not shown) of the NAND logic circuit 202.

In a particular embodiment, the clock gating system 200 may consume about 7% less power in an enabled state and may consume about three times less power in a disabled state than a clock gating circuit that has nine transistors that toggle with each transition of an input clock. The clock gating system 200 may use fewer devices and occupy an area that is about ⅓ smaller than an area of a conventional clock gating circuit. In another particular embodiment, an input capacitance of the clock gating system 200 is approximately 1.7 femtofarads (fF), and an input capacitance of the clock gating system 200 is approximately 2.1 fF. A setup time required to allow input 216 to reach the enable node 207 may be about 200 picoseconds (ps) slower for the clock gating system 200 during operation at 1.1 volts (V), 125 C in 65-nm technology. The clock gating system 200 may therefore enable design flow to optimize or improve clock gating paths based on area/speed/power tradeoffs.

Although in the illustrated embodiment the keeper circuit isolation element including the inverter 228 and the first NMOS transistor 230 prevents the enable node 207 from discharging during the delay period where the input clock signal 208 and the node 222 are both at the logical "1" state, in other embodiments the clock gating system 200 may not include the keeper circuit isolation element (i.e. may not include the inverter 228, the first NMOS 230, or both). For example, the keeper circuit may include the PMOS transistor 224 and the second NMOS transistor 232 without including the first NMOS transistor 230 and the inverter 228. The second NMOS transistor 232 may be coupled to the PMOS transistor 224 via the second isolation element 214. For example, the second NMOS transistor 232 may be connected to the second isolation element 214, without the intervening first NMOS transistor 230. The remaining transistors of the clock gating system 200 may be sized to slow the discharge of the internal enable node 207 to retain the logical "1" state at the internal enable node 207 during the delay period associated with the gating element.

One skilled in the art would recognize alternative embodiments of the clock gating system 200 that function as an equivalent to the clock gating system 200. For example, as previously discussed, various serially coupled elements may be reordered without impacting an operation of the clock gating system 200. In addition, a buffer could be added to delay the input clock signal 208 before connecting it to transistor 232 and/or transistor 234. As another example, a dual version of the clock gating system 200 could be generated by replacing every PMOS transistor in the clock gating system 200 with an NMOS transistor and every NMOS transistor with a PMOS transistor, as well as exchanging the supply and ground. In such a dual version, the NAND gate 202 would be a NOR gate, the output clock 238 would stop high when node 207 is high, and the keeper isolation element would prevent a logical voltage level change at the internal enable node 207 due to a current flow through the keeper circuit that results in a charging of the internal enable node 207 during a delay associated with the gating element when the input clock signal 208 transitions from a high logic level to a low logic level.

Figure 3:
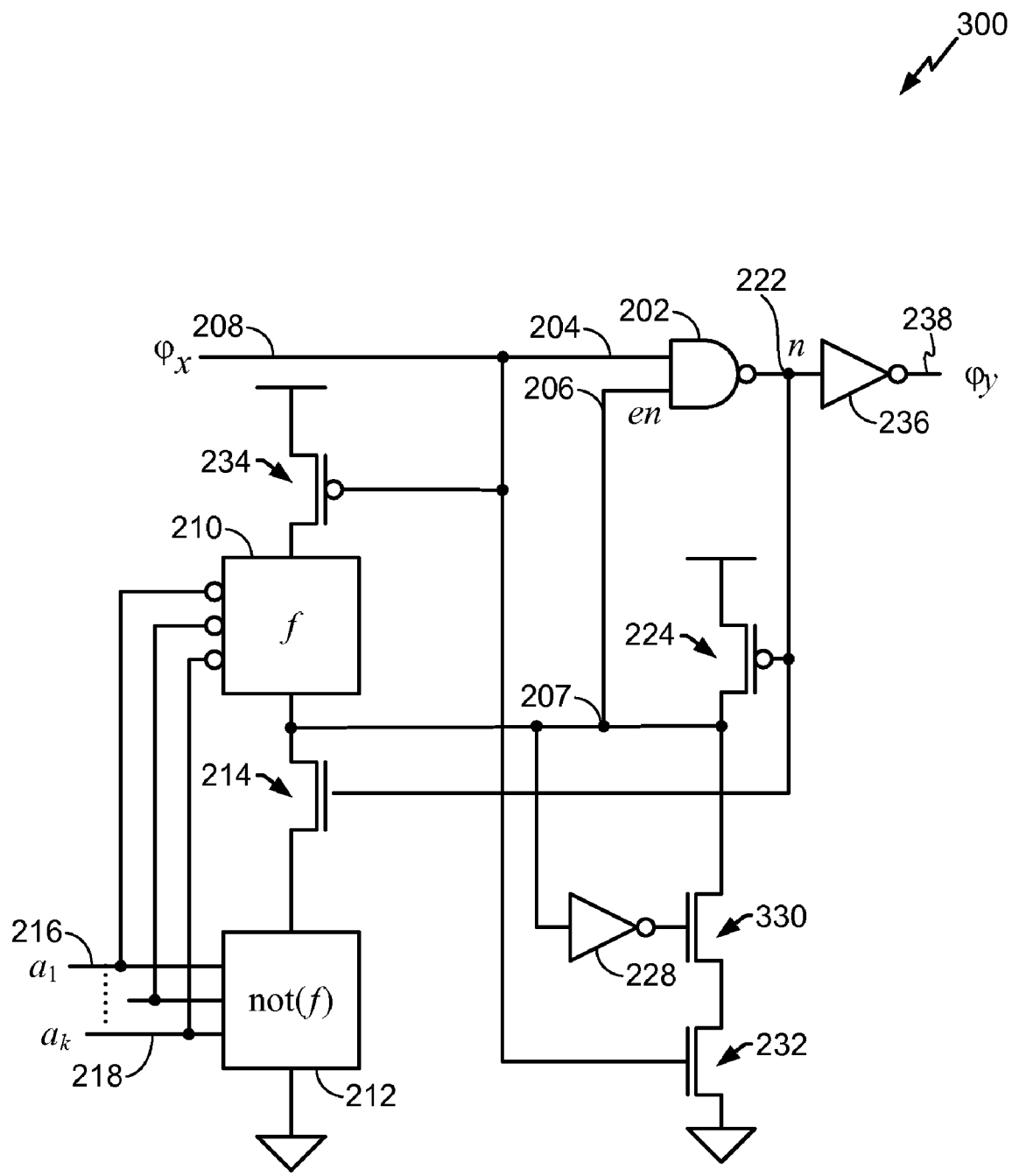
FIG. 3 is a circuit diagram of a second illustrated embodiment of a clock gating cell for use in a clock gating system.

Referring to FIG. 3, a second particular illustrative embodiment of a clock gating system is disclosed and generally designated 300. The clock gating system 300 includes circuit elements of the clock gating system 200 of FIG. 2, where common elements are indicated by common reference numbers, and operates in a logically equivalent manner as the clock gating system 200 of FIG. 2.

The keeper circuit of the clock gating system 300 includes a first NMOS transistor 330 that has a first terminal coupled to the enable node 207, in contrast to the first NMOS transistor 230 of FIG. 2 that is coupled to the enable node 207 via the second isolation element 214. In a particular embodiment, the keeper isolation element operates substantially similarly to the keeper isolation element including the inverter 228 and the first NMOS transistor 230 described with respect to FIG. 2.

Figure 4:
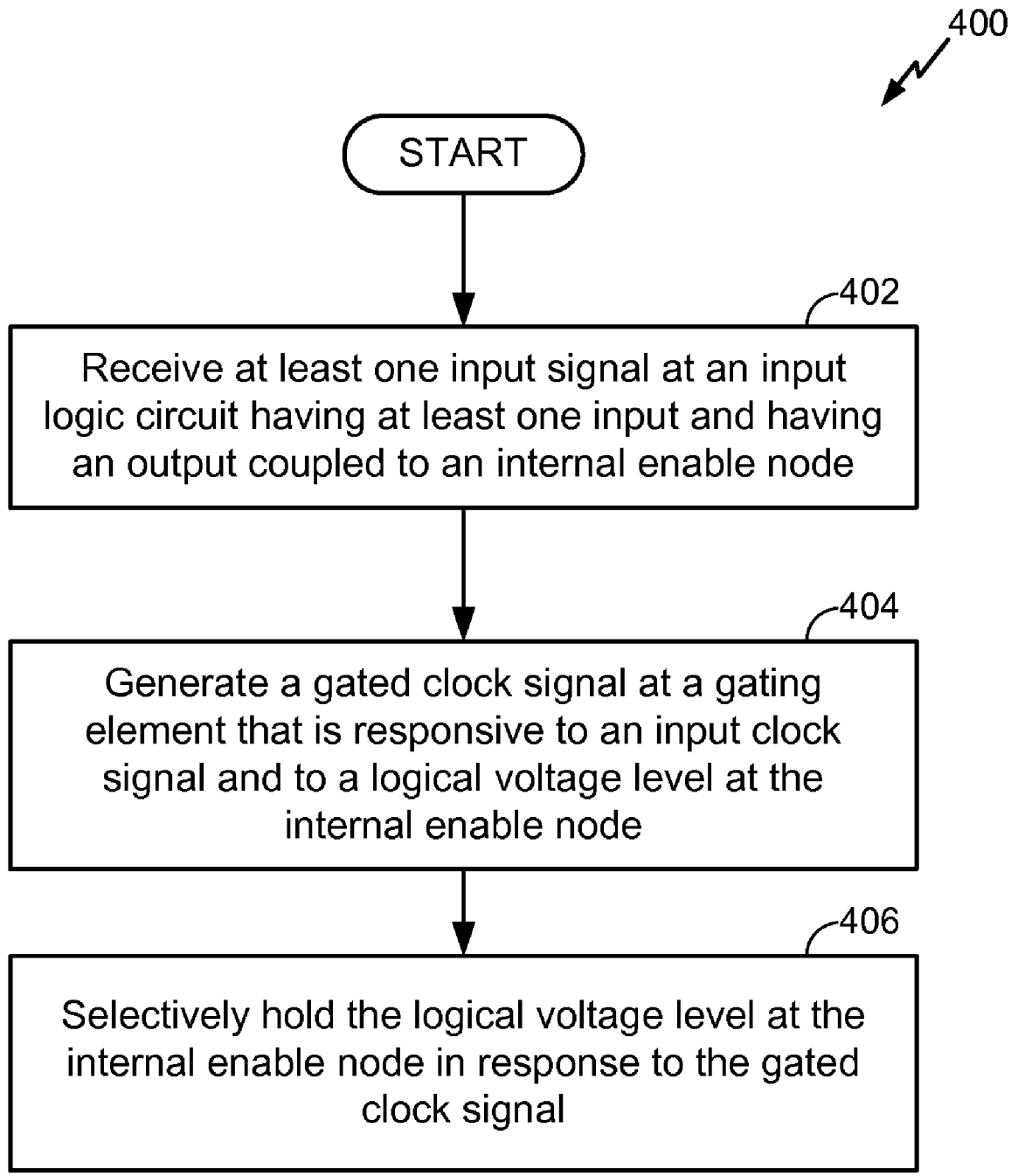
FIG. 4 is a flow chart of a particular illustrative embodiment of a method of generating a gated clock signal.

Referring to FIG. 4, a particular illustrative embodiment of a method of generating a gated clock signal is depicted and generally designated 400. In an illustrative embodiment, the method 400 may be performed by the system 100 of FIG. 1, the system 200 of FIG. 2, or the system 300 of FIG. 3.

In a particular embodiment, at 402, at least one input signal is received at an input logic circuit having at least one input and having an output coupled to an internal enable node. For example, the first input signal 216 and the second input signal 218 are received at the input logic circuit including the input pullup circuit 210 and the pulldown circuit 212, as shown in FIG. 2. Continuing to 404, a gated clock signal is generated at a gating element that is responsive to an input clock signal and to a logical voltage level at the internal enable node. For example, the gating element including the NAND logic gate 202 of FIG. 2 is responsive to the input clock signal 208 and to a voltage at the internal enable node 207 to generate the gated clock signal at the node 222, as shown in FIG. 2. Moving to 406, the logical voltage level is selectively held at the internal enable node in response to the gated clock signal. For example, the keeper circuit including the PMOS transistor 224 and the NMOS transistors 230 and 232 selectively holds a logical voltage level at the internal enable node 207 when the input clock signal 208 has a high logic level, as described with respect to FIG. 2.

In a particular embodiment, one of a first clock gating cell having a first keeper circuit or a second clock gating cell having a second keeper circuit can be selected based on at least one design criterion, where the first clock gating cell includes fewer transistors that toggle with each input clock signal toggle than the second clock gating cell. In a particular embodiment, at least one design criterion is power consumption, speed of operation, an area of the first clock gating cell, or an area of the second clock gating cell.

In another particular embodiment, the first clock gating cell includes less than nine but not less than four transistors that toggle in response to each clock signal toggle. For example, in an embodiment where the NAND logic circuit 202 of FIG. 2 is implemented using two NMOS transistors and two PMOS transistors, two of the transistors of the NAND logic circuit 202 are responsive to the input clock signal 208, in addition to the PMOS transistor 234 and the NMOS transistor 232, so that only four transistors toggle in response to every input clock transition. Other transistors, such as the PMOS transistor 224 and the isolation NMOS transistor 214 that are responsive to the gated clock signal, do not toggle with the input clock signal when the enable signal is at a logical "0" state, resulting in a corresponding reduction in power consumption due to reduced switching.

In another particular embodiment, fewer than half of the transistors of the first keeper circuit toggle in response to each input clock signal toggle. For example, only the second NMOS transistor 232 of the keeper circuit of FIG. 2 toggles with each transition of the input clock signal 208. In contrast, the PMOS transistor 224 is responsive to the gated clock signal at the node 222, and therefore will not toggle when the clock signal is gated. Likewise, the first NMOS transistor 230 is controlled based on the bias at the internal enable node 207 rather than the input clock signal 208.

Figure 5:
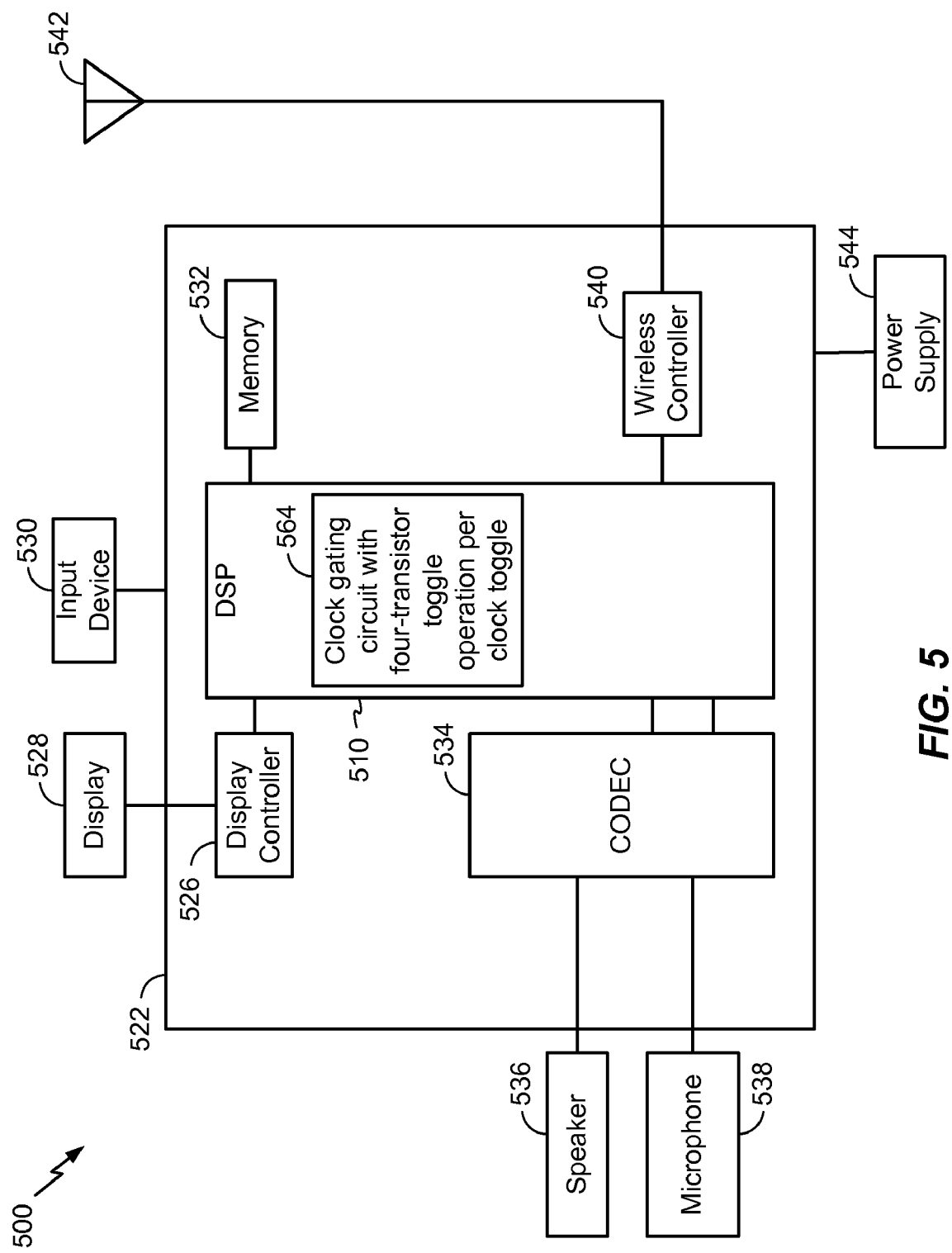
FIG. 5 is a block diagram of an illustrative communication device that includes a clock gating circuit with a four-transistor toggle operation.

FIG. 5 is a block diagram of an illustrative embodiment of a wireless communication device. The wireless communications device 500 includes a processor such as a digital signal processor (DSP) 510 that contains a clock gating circuit 564 with four transistor toggle operation per clock toggle. In a particular embodiment, the clock gating circuit 564 may include the system 100 of FIG. 1, the system 200 of FIG. 2, the system 300 of FIG. 3, or any combination thereof. Although the clock gating circuit 564 is illustrated as within the DSP 510, in other embodiments, the clock gating circuit 564 may be used with one or more other components of the wireless communication device 500. The wireless communication device 500 may be a cellular phone, a terminal, a handset, a personal digital assistant ("PDA"), a wireless modem, or other wireless device.

FIG. 5 also indicates that a display controller 526 is coupled to the DSP 510 and to a display 528. Additionally, a memory 532 is coupled to the DSP 510. In a particular embodiment, the memory 532 may be a computer readable tangible medium that stores instructions that are executable by a computer, such as the DSP 510, to provide at least one input signal to an input logic circuit of a clock gating cell of the clock gating circuit 564 to generate a gated clock signal based on the at least one input signal. A coder/decoder (CODEC) 534 is also coupled to the DSP 510. A speaker 536 and a microphone 538 are coupled to the CODEC 534. Also, a wireless controller 540 is coupled to the DSP 510 and to a wireless antenna 542. In a particular embodiment, a power supply 544 and an input device 530 are coupled to an on-chip system 522. In a particular embodiment, as illustrated in FIG. 5, the display 528, the input device 530, the speaker 536, the microphone 538, the wireless antenna 542, and the power supply 544 are external to the on-chip system 522. However, each is coupled to a component of the on-chip system 522.

Figure 6:
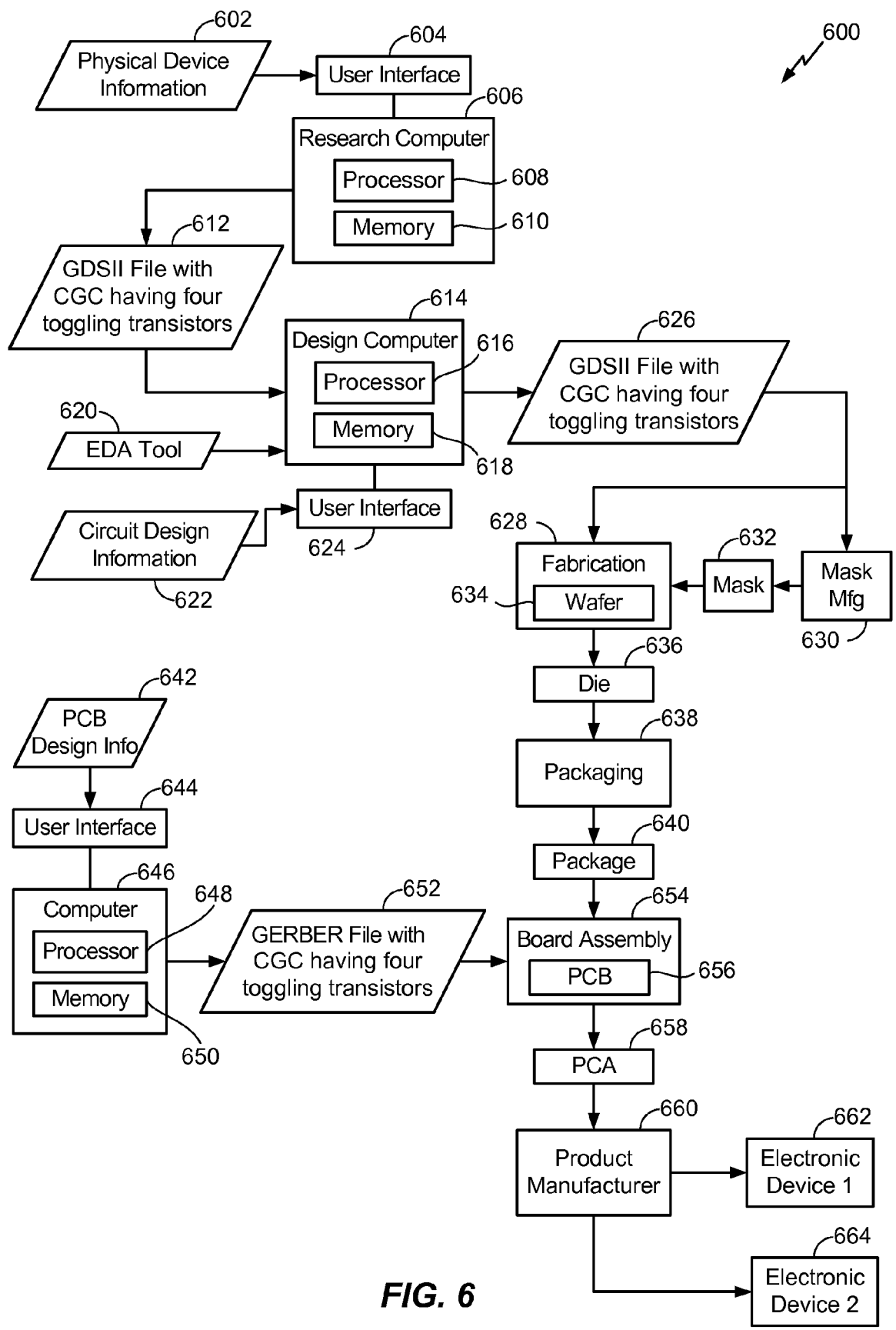
FIG. 6 is a block diagram of an illustrative embodiment of a manufacturing process that includes a clock gating circuit having four toggling transistors.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 6 depicts a particular illustrative embodiment of an electronic device manufacturing process 600.

Physical device information 602 is received in the manufacturing process 600, such as at a research computer 606. The physical device information 602 may include design information representing at least one physical property of a system used in a semiconductor device, such as the system 100 of FIG. 1, the system 200 of FIG. 2, the system 300 of FIG. 3, or any combination thereof. For example, the physical device information 602 may include physical parameters, material characteristics, and structure information that is entered via a user interface 604 coupled to the research computer 606. The research computer 606 includes a processor 608, such as one or more processing cores, coupled to a computer readable medium such as a memory 610. The memory 610 may store computer readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of semiconductor devices including the system 100 of FIG. 1, the system 200 of FIG. 2, the system 300 of FIG. 3, or any combination thereof that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a circuit using the system 100 of FIG. 1, the system 200 of FIG. 2, the system 300 of FIG. 3, or any combination thereof, in the library file 612. For example, a user of the design computer 614 may enter circuit design information 622 via a user interface 624 coupled to the design computer 614. The circuit design information 622 may include design information representing at least one physical property of the system 100 of FIG. 1, the system 200 of FIG. 2, the system 300 of FIG. 3, or any combination thereof. To illustrate, the circuit design property may include identification of particular circuits and relationships to other elements in a circuit design, positioning information, feature size information, interconnection information, or other information representing a physical property of a semiconductor device. The design computer 614 may select a clock gating system based on design criteria such as power consumption, area, speed of operation, or any combination thereof.

The design computer 614 may be configured to transform the design information, including the circuit design information 622 to comply with a file format. To illustrate, the file formation may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing the system 100 of FIG. 1, the system 200 of FIG. 2, the system 300 of FIG. 3, or any combination thereof in addition to other circuits or information. To illustrate, the data file may include information corresponding to a system-on-chip (SOC) that includes the system 100 of FIG. 1, the system 200 of FIG. 2, the system 300 of FIG. 3, or any combination thereof and that also includes additional electronic circuits and components within the SOC.

The GDSII file 626 may be received at a fabrication process 628 to manufacture the system 100 of FIG. 1, the system 200 of FIG. 2, the system 300 of FIG. 3, or any combination thereof, according to transformed information in the GDSII file 626. For example, a device manufacture process may include providing the GDSII file 626 to a mask manufacturer 630 to create one or more masks, such as masks to be used for photolithography processing, illustrated as a representative mask 632. The mask 632 may be used during the fabrication process to generate one or more wafers 634, which may be tested and separated into dies, such as a representative die 636. The die 636 includes a circuit including the system 100 of FIG. 1, the system 200 of FIG. 2, the system 300 of FIG. 3, or any combination thereof.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 610. A printed circuit board (PCB) tool may be stored as processor executable instructions at the memory 610 to process PCB design information 642 received from a user of the computer 646 via a user interface 644. The PCB design information 642 may include physical positioning information of a packaged semiconductor device on a circuit board, the packaged semiconductor device corresponding to the package 640 including the system 100 of FIG. 1, the system 200 of FIG. 2, or any combination thereof.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including the system 100 of FIG. 1, the system 200 of FIG. 2, the system 300 of FIG. 3, or any combination thereof. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines for performing various steps of a PCB production process. The PCB 656 may be populated with electronic components including the package 640 to form a represented printed circuit assembly (PCA) 658.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 662 and 664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although the system 100 of FIG. 1, the system 200 of FIG. 2, the system 300 of FIG. 3, or any combination thereof, may be implemented in a remote unit according to teachings of the disclosure, the disclosure is not limited to the exemplary illustrated unit. Embodiments of the disclosure may be suitably employed in any device which includes active integrated circuitry including memory and on-chip circuitry for test and characterization.

Thus, the system 100 of FIG. 1, the system 200 of FIG. 2, the system 300 of FIG. 3, or any combination thereof, may be fabricated, processed, and incorporated into an electronic device, as described in the illustrative process 600. One or more aspects of the embodiments disclosed with respect to FIGS. 1-5 may be included at various processing stages, such as within the library file 612, the GDSII file 626, and the GERBER file 652, as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. Although various representative stages of production from a physical device design to a final product are depicted, in other embodiments fewer stages may be used or additional stages may be included. Similarly, the process 600 may be performed by a single entity, or by one or more entities performing various stages of the process 600.

Those of skill would further appreciate that the various illustrative logical blocks, configurations, modules, circuits, and algorithm steps described in connection with the embodiments disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a hardware processor, or in a combination of the two. A software module may reside in a tangible memory device, such as a random access memory (RAM), a magnetoresistive random access memory (MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of tangible storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A clock gating circuit comprising:
an input logic circuit having at least one input to receive at least one input signal and having an output coupled to an internal enable node, wherein the input logic circuit includes a pullup circuit serially coupled via the internal enable node to a pulldown circuit, and further comprising:
   a first isolation element configured to selectively prevent the pullup circuit from biasing the internal enable node at a logical high voltage level; and
   a second isolation element configured to selectively prevent the pulldown circuit from biasing the internal enable node at a logical low level, wherein at least one of the first isolation element and the second isolation element is responsive to a gated clock signal;
a keeper circuit coupled to selectively hold a logical voltage level at the internal enable node, the keeper circuit including at least one switching element that is responsive to the gated clock signal; and
a gating element responsive to an input clock signal and to the logical voltage level at the internal enable node to generate the gated clock signal.

2. The clock gating circuit of claim 1, wherein the keeper circuit includes a keeper isolation element configured to prevent a logical voltage level change at the internal enable node due to a current flow through the keeper circuit during a delay period associated with the gating element when the input clock signal transitions.

3. The clock gating circuit of claim 1, wherein less than nine transistors toggle with each input clock signal transition.

4. The clock gating circuit of claim 1, wherein the keeper circuit comprises:
a p-channel metal-oxide-semiconductor (PMOS) transistor having a first terminal coupled to a supply, a control terminal coupled to receive the gated clock signal, and a second terminal coupled to an input logic isolation element;
a first n-channel metal-oxide-semiconductor (NMOS) transistor having a first terminal coupled to the second terminal of the PMOS transistor;
an inverter having an input coupled to the second terminal of the PMOS transistor and further having an output coupled to a control terminal of the first NMOS transistor; and
a second NMOS transistor having a first terminal coupled to the first NMOS transistor and having a second terminal coupled to a ground, wherein a control terminal of the second NMOS transistor is coupled to receive the input clock signal.

5. The clock gating circuit of claim 1, wherein the first terminal of the first NMOS transistor is coupled to the second terminal of the PMOS transistor via the input logic isolation element.

6. The clock gating circuit of claim 1, wherein the keeper circuit comprises:
a p-channel metal-oxide-semiconductor (PMOS) transistor having a first terminal coupled to a supply, a control terminal coupled to receive the gated clock signal, and a second terminal coupled to an input logic isolation element; and
an n-channel metal-oxide-semiconductor (NMOS) transistor having a first terminal coupled to the second terminal of the PMOS transistor via the input logic isolation element and having a second terminal coupled to a ground, wherein a control terminal of the NMOS transistor is coupled to receive the input clock signal.

7. A system comprising:
a NAND logic circuit having a first input coupled to receive a clock signal and having an output coupled to provide a gated clock signal; and
a keeper circuit coupled to provide an enable signal to a second input of the NAND logic circuit, wherein less than nine transistors but not less than four transistors toggle with each clock signal transition, wherein the keeper circuit comprises:
   a p-channel metal-oxide-semiconductor (PMOS) transistor having a first terminal coupled to a supply and having a control terminal coupled to receive the gated clock signal;
   a first n-channel metal-oxide-semiconductor (NMOS) transistor having a first terminal responsive to a second terminal of the PMOS transistor;
   an inverter having an input coupled to the second terminal of the PMOS transistor and further having an output coupled to a control terminal of a first NMOS transistor; and
   a second NMOS transistor having a first terminal coupled to the first NMOS transistor and having a second terminal coupled to ground, wherein a control terminal of the second NMOS transistor is coupled to receive the clock signal.

8. The system of claim 7, wherein the second terminal of the PMOS transistor is coupled to an input logic isolation element,
and wherein the first terminal of the first NMOS transistor is coupled to the second terminal of the PMOS transistor via the input logic isolation element.

9. The system of claim 7, wherein the NAND logic circuit and the keeper circuit are included in a communications device or a computer into which the system is integrated.

10. An apparatus comprising:
input logic means for receiving at least one input signal and providing an output coupled to an internal enable node;
keeper means for selectively holding a logical voltage level at the internal enable node, the keeper means including at least one switching element that is responsive to a gated clock signal, wherein the keeper means comprises:
   first means for switching having a first terminal coupled to a supply and having a control terminal coupled to receive the gated clock signal;
   second means for switching having a first terminal coupled to a second terminal of the first means for switching;
   means for inverting having an input coupled to the second terminal of the first means for switching and further having an output coupled to a control terminal of the first means for switching; and
   third means for switching having a first terminal coupled to the first means for switching and having a second terminal coupled to ground, wherein a control terminal of the second means for switching is coupled to receive the input clock signal; and
gating means for generating the gated clock signal, wherein the gating means is responsive to an input clock signal and to the logical voltage level at the internal enable node.

11. The apparatus of claim 10 integrated in a system-on-chip device.

12. The apparatus of claim 10, wherein the apparatus is a semiconductor device integrated into a communications device or a computer.

13. A method comprising:
receiving at least one input signal at an input logic circuit having at least one input and having an output coupled to an internal enable node;
generating a gated clock signal at a gating element that is responsive to an input clock signal and to a logical voltage level at the internal enable node;
selectively holding the logical voltage level at the internal enable node in response to the gated clock signal; and
selecting one of a first clock gating cell having a first keeper circuit and a second clock gating cell having a second keeper circuit based on at least one design criterion, wherein the first clock gating cell includes fewer transistors that toggle with each input clock signal toggle than the second clock gating cell, and wherein the first keeper circuit comprises:
a first field effect transistor (FET) having a first terminal coupled to a supply and having a control terminal coupled to receive the gated clock signal;
a second FET having a first terminal coupled to a second terminal of the first FET via an input logic isolation element;
an inverter having an input coupled to the second terminal of the first FET and further having an output coupled to a control terminal of the second FET; and
a third FET having a first terminal coupled to the second FET and having a second terminal coupled to ground, wherein a control terminal of the third FET is coupled to receive the input clock signal.

14. The method of claim 13, wherein receiving the at least one input signal, selectively holding the logical voltage level, and generating the gated clock signal are performed at a processor integrated into an electronic device.

15. The method of claim 13, wherein the at least one design criterion includes power consumption.

16. The method of claim 13, wherein the at least one design criterion includes speed of operation.

17. The method of claim 13, wherein the at least one design criterion includes an area of the first clock gating cell or an area of the second clock gating cell.

18. The method of claim 13, wherein the first clock gating cell includes not more than four transistors that toggle in response to each input clock signal toggle.

19. The method of claim 13, wherein fewer than half of the transistors of the first keeper circuit toggle in response to each input clock signal toggle.

20. The method of claim 13, wherein the first FET comprises a p-channel metal-oxide-semiconductor (PMOS) transistor, wherein the second FET comprises a first n-channel metal-oxide-semiconductor (NMOS) transistor, and where the third FET comprises a second NMOS transistor.

21. The method of claim 13, wherein the first terminal of the second FET is coupled to a second terminal of the first FET via an input logic isolation element.

22. A system comprising:
an input logic circuit of a clock gating cell, the input logic having at least one input to receive at least one input signal and having an output coupled to an internal enable node; and
a keeper circuit of the clock gating cell coupled to selectively hold a logical voltage level at the internal enable node, the keeper circuit including at least one switching element that is responsive to a gated clock signal generated at the clock gating cell, wherein the clock gating cell includes not more than four transistors that toggle with each transition of an input clock signal, and wherein the keeper circuit comprises:
a p-channel metal-oxide-semiconductor (PMOS) transistor having a first terminal coupled to a supply and having a control terminal coupled to receive the gated clock signal;
a first n-channel metal-oxide-semiconductor (NMOS) transistor having a first terminal coupled to a second terminal of the PMOS transistor;
an inverter having an input coupled to the second terminal of the PMOS transistor and further having an output coupled to a control terminal of the first NMOS transistor; and
a second NMOS transistor having a first terminal coupled to the first NMOS transistor and having a second terminal coupled to ground, wherein a control terminal of the second NMOS transistor is coupled to receive the input clock signal.

23. A clock gating circuit comprising:
an input logic circuit having at least one input to receive at least one input signal and having an output coupled to an internal enable node;
a keeper circuit coupled to selectively hold a logical voltage level at the internal enable node, the keeper circuit including at least one switching element that is responsive to a gated clock signal; and
a gating element responsive to an input clock signal and to the logical voltage level at the internal enable node to generate the gated clock signal;
wherein the keeper circuit includes a keeper isolation element configured to prevent a logical voltage level change at the internal enable node due to a current flow through the keeper circuit during a delay period associated with the gating element when the input clock signal transitions.

24. A clock gating circuit comprising:
an input logic circuit having at least one input to receive at least one input signal and having an output coupled to an internal enable node;
a keeper circuit coupled to selectively hold a logical voltage level at the internal enable node, the keeper circuit including at least one switching element that is responsive to a gated clock signal, wherein the keeper circuit comprises:
a p-channel metal-oxide-semiconductor (PMOS) transistor having a first terminal coupled to a supply, a control terminal coupled to receive the gated clock signal, and a second terminal coupled to an input logic isolation element;
a first n-channel metal-oxide-semiconductor (NMOS) transistor responsive to the PMOS transistor;
an inverter having an input coupled to the PMOS transistor and further having an output coupled to a control terminal of the first NMOS transistor; and
a second NMOS transistor having a first terminal coupled to the first NMOS transistor and having a second terminal coupled to ground, wherein a control terminal of the second NMOS transistor is coupled to receive the input clock signal; and
a gating element responsive to an input clock signal and to the logical voltage level at the internal enable node to generate the gated clock signal.

25. A clock gating circuit comprising:
an input logic circuit having at least one input to receive at least one input signal and having an output coupled to an internal enable node;
a keeper circuit coupled to selectively hold a logical voltage level at the internal enable node, the keeper circuit including at least one switching element that is responsive to a gated clock signal, wherein the keeper circuit comprises:
- a p-channel metal-oxide-semiconductor (PMOS) transistor having a first terminal coupled to a supply, a control terminal coupled to receive the gated clock signal, and a second terminal coupled to an input logic isolation element; and
- an n-channel metal-oxide-semiconductor (NMOS) transistor having a first terminal responsive to the second terminal of the PMOS transistor and responsive to the input logic isolation element and having a second terminal coupled to a ground, wherein a control terminal of the NMOS transistor is coupled to receive the input clock signal; and a gating element responsive to an input clock signal and to the logical voltage level at the internal enable node to generate the gated clock signal.

* * * * *

UNITED STATES PATENT AND TRADEMARK OFFICE
CERTIFICATE OF CORRECTION

| | | |
|---|---|---|
| PATENT NO. | : 7,902,878 B2 | Page 1 of 1 |
| APPLICATION NO. | : 12/431992 | |
| DATED | : March 8, 2011 | |
| INVENTOR(S) | : Martin Saint-Laurent | |

It is certified that error appears in the above-identified patent and that said Letters Patent is hereby corrected as shown below:

On the title page item [75]:
Line 04, "Austin, TX" to read as Pflugerville, TX for inventor Bassam Jamil Mohd Signed and Sealed this
Second Day of August, 2011

David J. Kappos
*Director of the United States Patent and Trademark Office*